United States Patent
Dube et al.

(10) Patent No.: US 10,125,636 B2
(45) Date of Patent: Nov. 13, 2018

(54) BOWED ROTOR PREVENTION SYSTEM USING WASTE HEAT

(71) Applicant: United Technologies Corporation, Farmington, CT (US)

(72) Inventors: David P. Dube, Saco, ME (US); Richard K. Hayford, Cape Neddick, ME (US)

(73) Assignee: UNITED TECHNOLOGIES CORPORATION, Farmington, CT (US)

( * ) Notice: Subject to any disclaimer, the term of this patent is extended or adjusted under 35 U.S.C. 154(b) by 244 days.

(21) Appl. No.: 15/042,372

(22) Filed: Feb. 12, 2016

(65) Prior Publication Data

US 2017/0234166 A1    Aug. 17, 2017

(51) Int. Cl.
| | |
|---|---|
| F01D 25/36 | (2006.01) |
| F01D 21/00 | (2006.01) |
| F02C 7/275 | (2006.01) |
| H01L 35/30 | (2006.01) |
| F02C 3/04 | (2006.01) |
| F02C 6/14 | (2006.01) |
| F02C 7/12 | (2006.01) |
| F02C 9/00 | (2006.01) |

(52) U.S. Cl.
CPC ............. *F01D 25/36* (2013.01); *F01D 21/00* (2013.01); *F02C 3/04* (2013.01); *F02C 6/14* (2013.01); *F02C 7/12* (2013.01); *F02C 7/275* (2013.01); *F02C 9/00* (2013.01); *H01L 35/30* (2013.01); *F05D 2220/32* (2013.01); *F05D 2220/60* (2013.01); *F05D 2220/76* (2013.01); *F05D 2260/20* (2013.01); *F05D 2260/941* (2013.01); *F05D 2270/114* (2013.01)

(58) Field of Classification Search
CPC .. F02C 7/268; F02C 7/27; F02C 7/272; F02C 7/275; F02C 7/277; F02C 3/107; F02C 9/00; F01D 19/02; F05D 2260/85; F05D 2270/021; F05D 2270/114; F05D 2270/304; F05D 2270/334
See application file for complete search history.

(56) References Cited

U.S. PATENT DOCUMENTS

| | | |
|---|---|---|
| 1,951,875 A | 3/1934 | Laabs |
| 2,617,253 A | 11/1952 | Fusner et al. |

(Continued)

FOREIGN PATENT DOCUMENTS

| | | |
|---|---|---|
| EP | 1396611 | 3/2004 |
| EP | 1533479 A2 | 5/2005 |

(Continued)

OTHER PUBLICATIONS

U.S. Appl. No. 15/042,331 Non-Final Office Action dated Sep. 9, 2016, 37 pages.

(Continued)

*Primary Examiner* — Steven Sutherland
(74) *Attorney, Agent, or Firm* — Cantor Colburn LLP

(57) ABSTRACT

A bowed rotor prevention system for a gas turbine engine is provided. The bowed rotor prevention system includes a thermoelectric generator system operable to produce electricity from waste heat of the gas turbine engine. The bowed rotor prevention system also includes a bowed rotor prevention motor operable to drive rotation of turbomachinery of the gas turbine engine using the electricity produced by the thermoelectric generator system.

17 Claims, 3 Drawing Sheets

(56) References Cited

U.S. PATENT DOCUMENTS

| | | |
|---|---|---|
| 2,962,597 A | 11/1960 | Evans |
| 3,057,155 A | 10/1962 | Rizk |
| 3,151,452 A | 10/1964 | Bunger et al. |
| 3,290,709 A | 12/1966 | Whitenack, Jr. et al. |
| 3,360,844 A | 1/1968 | Wonneman |
| 3,764,815 A | 10/1973 | Habock et al. |
| 3,793,905 A | 2/1974 | Black et al. |
| 3,898,439 A | 8/1975 | Reed et al. |
| 3,951,008 A | 4/1976 | Schneider et al. |
| 4,044,550 A | 8/1977 | Vermilye |
| 4,069,424 A | 1/1978 | Burkett |
| 4,120,159 A | 10/1978 | Matsumoto et al. |
| 4,144,421 A | 3/1979 | Sakai |
| 4,302,813 A | 11/1981 | Kurihara et al. |
| 4,353,604 A | 10/1982 | Dulberger et al. |
| 4,380,146 A | 4/1983 | Yannone et al. |
| 4,426,641 A | 1/1984 | Kurihara et al. |
| 4,435,770 A | 3/1984 | Shiohata et al. |
| 4,437,163 A | 3/1984 | Kurihara et al. |
| 4,453,407 A | 6/1984 | Sato et al. |
| 4,485,678 A | 12/1984 | Fanuele |
| 4,488,240 A | 12/1984 | Kapadia et al. |
| 4,496,252 A | 1/1985 | Horler et al. |
| 4,598,551 A | 7/1986 | Dimitroff, Jr. et al. |
| 4,627,234 A | 12/1986 | Schuh |
| 4,642,782 A | 2/1987 | Kemper et al. |
| 4,669,893 A | 6/1987 | Chalaire et al. |
| 4,713,985 A | 12/1987 | Ando |
| 4,733,529 A | 3/1988 | Nelson et al. |
| 4,747,270 A | 5/1988 | Klie et al. |
| 4,854,120 A | 8/1989 | Nelson et al. |
| 4,979,362 A | 12/1990 | Vershure, Jr. |
| 5,103,629 A | 4/1992 | Mumford et al. |
| 5,123,239 A | 6/1992 | Rodgers |
| 5,127,220 A | 7/1992 | Jesrai et al. |
| 5,174,109 A | 12/1992 | Lampe |
| 5,184,458 A | 2/1993 | Lampe et al. |
| 5,201,798 A | 4/1993 | Hogan |
| 5,349,814 A | 9/1994 | Ciokajlo et al. |
| 6,146,090 A | 11/2000 | Schmidt |
| 6,168,377 B1 | 1/2001 | Wolfe et al. |
| 6,190,127 B1 | 2/2001 | Schmidt |
| 6,318,958 B1 | 11/2001 | Giesler et al. |
| 6,478,534 B2 | 11/2002 | Bangert et al. |
| 6,498,978 B2 | 12/2002 | Leamy et al. |
| 6,517,314 B1 | 2/2003 | Burnett et al. |
| 6,558,118 B1 | 5/2003 | Brisson et al. |
| 6,681,579 B2 | 1/2004 | Lane et al. |
| 6,762,512 B2 | 7/2004 | Nelson |
| 7,104,072 B2 | 9/2006 | Thompson |
| 7,133,801 B2 | 11/2006 | Song |
| 7,409,319 B2 | 8/2008 | Kant et al. |
| 7,428,819 B2 | 9/2008 | Cataldi et al. |
| 7,507,070 B2 | 3/2009 | Jones |
| 7,543,439 B2 | 6/2009 | Butt et al. |
| 7,587,133 B2 | 9/2009 | Franke et al. |
| 7,742,881 B2 | 6/2010 | Muralidharan et al. |
| 7,798,720 B1 | 9/2010 | Walsh |
| 7,909,566 B1 | 3/2011 | Brostmeyer |
| 7,972,105 B2 | 7/2011 | Dejoris et al. |
| 8,090,456 B2 | 1/2012 | Karpman et al. |
| 8,291,715 B2 | 10/2012 | Libera et al. |
| 8,306,776 B2 | 11/2012 | Ihara et al. |
| 8,770,913 B1 | 7/2014 | Negron et al. |
| 8,776,530 B2 | 7/2014 | Shirooni et al. |
| 8,820,046 B2 | 9/2014 | Ross et al. |
| 8,918,264 B2 | 12/2014 | Jegu et al. |
| 9,086,018 B2 | 7/2015 | Winston et al. |
| 9,121,309 B2 | 9/2015 | Geiger |
| 9,699,833 B2 | 7/2017 | Broughton et al. |
| 2002/0173897 A1 | 11/2002 | Leamy et al. |
| 2003/0145603 A1 | 8/2003 | Reed et al. |
| 2004/0065091 A1 | 4/2004 | Anderson |
| 2004/0131138 A1 | 7/2004 | Correia et al. |
| 2006/0032234 A1 | 2/2006 | Thompson |
| 2006/0260323 A1 | 11/2006 | Moulebhar |
| 2007/0031249 A1 | 2/2007 | Jones |
| 2008/0072568 A1 | 3/2008 | Moniz et al. |
| 2009/0246018 A1 | 10/2009 | Kondo et al. |
| 2009/0301053 A1 | 12/2009 | Geiger |
| 2009/0314002 A1 | 12/2009 | Libera et al. |
| 2010/0095791 A1 | 4/2010 | Galloway |
| 2010/0132365 A1 | 6/2010 | Labala |
| 2010/0293961 A1 | 11/2010 | Tong et al. |
| 2010/0326085 A1 | 12/2010 | Veilleux |
| 2011/0077783 A1 | 3/2011 | Karpman et al. |
| 2011/0146276 A1 | 6/2011 | Sathyanarayana et al. |
| 2011/0153295 A1 | 6/2011 | Yerramalla et al. |
| 2011/0296843 A1 | 12/2011 | Lawson, Jr. |
| 2012/0031067 A1 | 2/2012 | Sundaram et al. |
| 2012/0240591 A1 | 9/2012 | Snider et al. |
| 2012/0266601 A1 | 10/2012 | Miller |
| 2012/0316748 A1 | 12/2012 | Jegu et al. |
| 2013/0031912 A1 | 2/2013 | Finney et al. |
| 2013/0091850 A1 | 4/2013 | Francisco |
| 2013/0101391 A1 | 4/2013 | Szwedowicz et al. |
| 2013/0134719 A1 | 5/2013 | Watanabe et al. |
| 2013/0251501 A1 | 9/2013 | Araki et al. |
| 2014/0060076 A1 | 3/2014 | Cortelli et al. |
| 2014/0123673 A1 | 5/2014 | Mouze et al. |
| 2014/0199157 A1 | 7/2014 | Haerms et al. |
| 2014/0236451 A1 | 8/2014 | Gerez et al. |
| 2014/0241878 A1 | 8/2014 | Herrig et al. |
| 2014/0271152 A1 | 9/2014 | Rodriguez |
| 2014/0301820 A1 | 10/2014 | Lohse et al. |
| 2014/0318144 A1 | 10/2014 | Lazzeri et al. |
| 2014/0334927 A1 | 11/2014 | Hammerum |
| 2014/0366546 A1 | 12/2014 | Bruno et al. |
| 2014/0373518 A1 | 12/2014 | Manneville et al. |
| 2014/0373552 A1 | 12/2014 | Zaccaria et al. |
| 2014/0373553 A1 | 12/2014 | Zaccaria et al. |
| 2014/0373554 A1 | 12/2014 | Pech et al. |
| 2015/0016949 A1 | 1/2015 | Smith |
| 2015/0115608 A1 | 4/2015 | Draper |
| 2015/0121874 A1 | 5/2015 | Yoshida et al. |
| 2015/0128592 A1 | 5/2015 | Filiputti et al. |
| 2015/0159625 A1 | 6/2015 | Hawdwicke, Jr. et al. |
| 2015/0219121 A1 | 8/2015 | King |
| 2015/0377141 A1 | 12/2015 | Foiret |
| 2016/0236369 A1 | 8/2016 | Baker |
| 2016/0245312 A1 | 8/2016 | Morice |
| 2016/0265387 A1 | 9/2016 | Duong et al. |
| 2016/0288325 A1 | 10/2016 | Naderer et al. |
| 2017/0030265 A1 | 2/2017 | O'Toole et al. |
| 2017/0218848 A1 | 8/2017 | Alstad et al. |
| 2017/0233103 A1 | 8/2017 | Teicholz et al. |
| 2017/0234158 A1 | 8/2017 | Savela |
| 2017/0234167 A1 | 8/2017 | Stachowiak et al. |
| 2017/0234230 A1 | 8/2017 | Schwarz et al. |
| 2017/0234231 A1 | 8/2017 | Virtue, Jr. et al. |
| 2017/0234232 A1 | 8/2017 | Sheridan et al. |
| 2017/0234233 A1 | 8/2017 | Schwarz et al. |
| 2017/0234235 A1 | 8/2017 | Pech |
| 2017/0234236 A1 | 8/2017 | Feulner et al. |
| 2017/0234238 A1 | 8/2017 | Schwarz et al. |
| 2018/0010480 A1 | 1/2018 | Hockaday et al. |

FOREIGN PATENT DOCUMENTS

| | | |
|---|---|---|
| EP | 1862875 | 12/2007 |
| EP | 2006496 | 12/2008 |
| EP | 2305986 | 4/2011 |
| EP | 2363575 A2 | 9/2011 |
| EP | 2871333 | 5/2015 |
| EP | 3051074 | 8/2016 |
| FR | 2933131 | 1/2010 |
| GB | 1374810 | 11/1974 |
| GB | 2117842 | 10/1983 |
| GB | 2218751 | 11/1989 |
| IN | 201408865 | 5/2015 |
| JP | 2002371806 | 12/2002 |
| JP | 2004036414 | 2/2004 |
| WO | 9900585 | 1/1999 |
| WO | 2013007912 | 1/2013 |

(56) References Cited

FOREIGN PATENT DOCUMENTS

| WO | 2014152701 | 9/2014 |
|----|------------|--------|
| WO | 2015030946 | 3/2015 |
| WO | 2016069303 | 5/2016 |

OTHER PUBLICATIONS

EP Application No. 17155584 Extended European Search Report dated Jul. 6, 2017, 9 pages.
EP Application No. 17155601 Extended European Search Report dated Jun. 30, 2017, 7 pages.
EP Application No. 17155612 Extended European Search Report dated Jul. 4, 2017, 8 pages.
EP Application No. 17155613 Extended European Search Report dated Jun. 27, 2017, 10 pages.
EP Application No. 17155683 Extended European Search Report dated Jun. 30, 2017, 8 pages.
EP Application No. 17155687 Extended European Search Report dated Jun. 16, 2017, 9 pages.
EP Application No. 17155698 Extended European Search Report dated Jun. 21, 2017, 9 pages.
EP Application No. 17155721 Extended European Search Report dated Jun. 27, 2017, 8 pages.
EP Application No. 17155793 Extended European Search Report dated Jun. 30, 2017, 10 pages.
EP Application No. 17155798 Extended European Search Report dated Jun. 30, 2017, 9 pages.
EP Application No. 17155807 Extended European Search Report dated Jul. 3, 2017, 8 pages.
Extended European Search Report for Application No. 17179407.6-1610 dated Dec. 5, 2017 (8 pp.).
EP Application No. 17155683 Office Action dated May 22, 2018, 2 pages.

BOWED ROTOR PREVENTION SYSTEM USING WASTE HEAT

BACKGROUND

This disclosure relates to gas turbine engines, and more particularly to a bowed rotor prevention system using waste heat.

Gas turbine engines are used in numerous applications, one of which is for providing thrust to an aircraft. When a gas turbine engine of an aircraft has been shut off for example, after an aircraft has landed at an airport, the engine is hot and due to heat rise, the upper portions of the engine will be hotter than lower portions of the engine. When this occurs thermal expansion may cause deflection of components of the engine which may result in a "bowed rotor" condition. If a gas turbine engine is in such a "bowed rotor" condition it is undesirable to restart or start the engine.

Accordingly, it is desirable to provide a method and/or apparatus for preventing a "bowed rotor" condition.

BRIEF DESCRIPTION

In one embodiment, a bowed rotor prevention system for a gas turbine engine is provided. The bowed rotor prevention system includes a thermoelectric generator system operable to produce electricity from waste heat of the gas turbine engine. The bowed rotor prevention system also includes a bowed rotor prevention motor operable to drive rotation of turbomachinery of the gas turbine engine using the electricity produced by the thermoelectric generator system.

In addition to one or more of the features described above, or as an alternative to any of the foregoing embodiments, further embodiments may include where the bowed rotor prevention motor is an electric motor.

In addition to one or more of the features described above, or as an alternative to any of the foregoing embodiments, further embodiments may include a controller operable to selectively apply the electricity to the bowed rotor prevention motor based on detecting an engine shutdown condition of the gas turbine engine.

In addition to one or more of the features described above, or as an alternative to any of the foregoing embodiments, further embodiments may include a battery operable to store an excess portion of the electricity and regulate delivery of the electricity to the bowed rotor prevention motor.

In addition to one or more of the features described above, or as an alternative to any of the foregoing embodiments, further embodiments may include where the thermoelectric generator system includes a plurality of thermoelectric generator devices thermally coupled to the gas turbine engine.

In addition to one or more of the features described above, or as an alternative to any of the foregoing embodiments, further embodiments may include where the thermoelectric generator devices are coupled to a case of the gas turbine engine.

In addition to one or more of the features described above, or as an alternative to any of the foregoing embodiments, further embodiments may include where the bowed rotor prevention motor drives rotation of a drive gear that rotates a high pressure spool of the gas turbine engine.

In addition to one or more of the features described above, or as an alternative to any of the foregoing embodiments, further embodiments may include where the gas turbine engine is a turbofan engine.

In addition to one or more of the features described above, or as an alternative to any of the foregoing embodiments, further embodiments may include where the gas turbine engine is an industrial gas turbine engine.

In another embodiment, a gas turbine engine includes a drive gear configured to be coupled to a spool of the gas turbine engine and a bowed rotor prevention system. The bowed rotor prevention system includes a thermoelectric generator system operable to produce electricity from waste heat of the gas turbine engine. The bowed rotor prevention system also includes a bowed rotor prevention motor operable to drive rotation of turbomachinery of the gas turbine engine through the drive gear using the electricity produced by the thermoelectric generator system.

In a further embodiment, a method of bowed rotor prevention for a gas turbine engine using waste heat is provided. Electricity is generated using a thermoelectric generator system coupled to the gas turbine engine. The electricity is selectively applied to a bowed rotor prevention motor to drive rotation of turbomachinery of the gas turbine engine.

In addition to one or more of the features described above, or as an alternative to any of the foregoing embodiments, further embodiments may include where selectively applying the electricity to the bowed rotor prevention motor is based on detecting an engine shutdown condition of the gas turbine engine.

In addition to one or more of the features described above, or as an alternative to any of the foregoing embodiments, further embodiments may include storing an excess portion of the electricity in a battery and regulating delivery of the electricity to the bowed rotor prevention motor through the battery.

In addition to one or more of the features described above, or as an alternative to any of the foregoing embodiments, further embodiments may include where the bowed rotor prevention motor drives rotation of turbomachinery of the gas turbine engine at less than a starting speed of the gas turbine engine when powered by the thermoelectric generator system.

BRIEF DESCRIPTION OF THE DRAWINGS

The subject matter which is regarded as the present disclosure is particularly pointed out and distinctly claimed in the claims at the conclusion of the specification. The foregoing and other features, and advantages of the present disclosure are apparent from the following detailed description taken in conjunction with the accompanying drawings in which:

Figure 1:
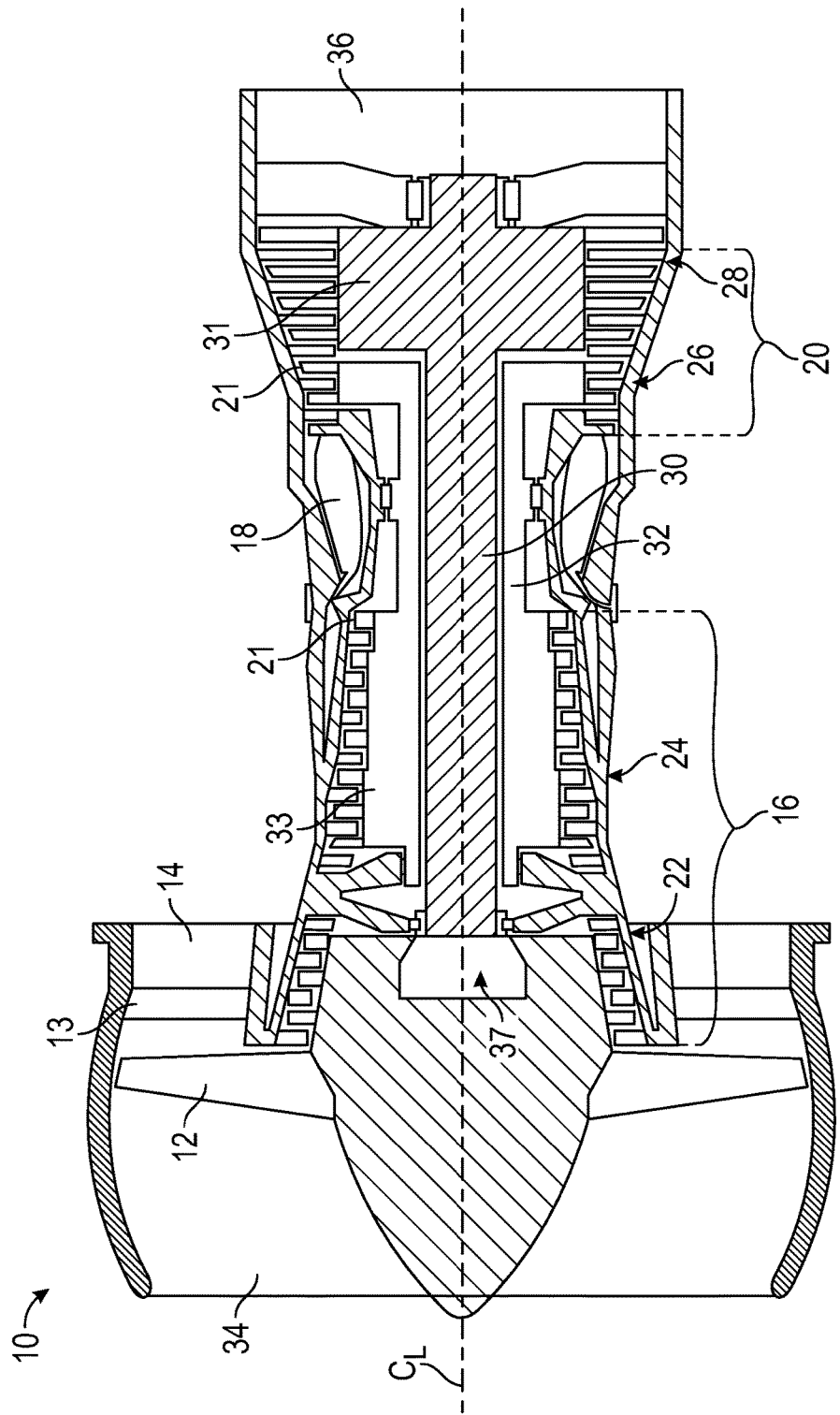
FIG. 1 is a view of a gas turbine engine.

While the above-identified drawing figures set forth one or more embodiments of the invention, other embodiments are also contemplated. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present disclosure may include features and components not specifically shown in the drawings. Like reference numerals identify similar structural elements.

DETAILED DESCRIPTION

Various embodiments of the present disclosure are related to bowed rotor prevention in a gas turbine engine. Embodiments prevent a bowed rotor condition by using a bowed rotor prevention motor to drive rotation of the gas turbine engine as powered directly or indirectly using a thermoelectric generator system. When powered by the thermoelectric generator system, the bowed rotor prevention motor can rotate turbomachinery of the gas turbine engine at very low speed (e.g., <5 revolutions per minute (RPM)) in order to equalize the thermal gradient of the rotating parts after engine shutdown. The bowed rotor prevention motor can interface through any gear interface of the engine, such as a starter drive gear interface. The power requirements of the bowed rotor prevention motor are substantially reduced in that the rotation needed to equalize the thermal gradients may be on the order of 1-3 RPM. Upon engine shutdown, the bowed rotor prevention motor can be controlled to rotate the turbomachinery, e.g., a high pressure spool of the gas turbine engine, for a period of time (30-40 minutes, for example) as powered by the thermoelectric generator system. In one embodiment, rotation continues until an insufficient amount of electricity is generated by the bowed rotor prevention system, unless a request to halt rotation is received. By slow and/or periodic rotation of the turbomachinery, a bow condition is prevented/eliminated.

Embodiments avoid high speed rotation (e.g., 5000-7000 RPM) of the engine after shutdown and also avoid requiring a flight crew to monitor the temperature of each engine of a multi-engine aircraft for several minutes prior to restarting each engine. Rather than using a ground cart or other external source to drive engine rotation (e.g., an external pneumatic system) or an auxiliary power unit of the aircraft that is typically used to rotate turbomachinery of the engine at a starting speed, embodiments use a thermoelectric generator system to power a low-speed and high torque electric motor as the bowed rotor prevention motor operable to slowly rotate (e.g., <5 RPM) the turbomachinery after engine shutdown. Embodiments of the bowed rotor prevention motor can be dedicated for use in bowed rotor prevention, and as such, sized with a lower weight and volume than would be needed to drive rotation of the engine at or above an engine starting speed.

Various embodiments of this disclosure may be applied on any turbomachinery component that requires cooling after shutdown. For example, gas turbine engines are rotary-type combustion turbine engines built around a power core made up of a compressor, combustor and turbine, arranged in flow series with an upstream inlet and downstream exhaust. The compressor compresses air from the inlet, which is mixed with fuel in the combustor and ignited to generate hot combustion gas. The turbine extracts energy from the expanding combustion gas, and drives the compressor via a common shaft. Energy is delivered in the form of rotational energy in the shaft, reactive thrust from the exhaust, or both.

Gas turbine engines provide efficient, reliable power for a wide range of applications, including aviation and industrial power generation. Smaller-scale engines such as auxiliary power units typically utilize a one-spool design, with co-rotating compressor and turbine sections. Larger-scale jet engines and industrial gas turbines are generally arranged into a number of coaxially nested spools, which operate at different pressures and temperatures, and rotate at different speeds.

The individual compressor and turbine sections in each spool are subdivided into a number of stages, which are formed of alternating rows of rotor blade and stator vane airfoils. The airfoils are shaped to turn, accelerate and compress the working fluid flow, or to generate lift for conversion to rotational energy in the turbine.

Aviation applications include turbojet, turbofan, turboprop and turboshaft engines. In turbojet engines, thrust is generated primarily from the exhaust. Modern fixed-wing aircraft generally employ turbofan and turboprop designs, in which the low pressure spool is coupled to a propulsion fan or propeller. Turboshaft engines are typically used on rotary-wing aircraft, including helicopters.

Turbofan engines are commonly divided into high and low bypass configurations. High bypass turbofans generate thrust primarily from the fan, which drives airflow through a bypass duct oriented around the engine core. This design is common on commercial aircraft and military transports, where noise and fuel efficiency are primary concerns. Low bypass turbofans generate proportionally more thrust from the exhaust flow, providing greater specific thrust for use on high-performance aircraft, including supersonic jet fighters. Unducted (open rotor) turbofans and ducted propeller engines are also known, in a variety of counter-rotating and aft-mounted configurations.

Referring now to FIG. 1, a view of a gas turbine engine 10, in a turbofan configuration is illustrated. The illustrated gas turbine engine 10 includes a propulsion fan 12 mounted inside a bypass duct 14 upstream of a fan exit guide vane 13. A power core of the engine is formed by a compressor section 16, a combustor 18 and a turbine section 20. A rotor in the compressor section 16 and/or the turbine section 20 may be subject to deflection or bowing if a thermal gradient forms after engine shutdown, causing rotor blades (or airfoils) 21 to interfere with the adjacent casing structure.

In the two-spool, high bypass configuration of FIG. 1, compressor section 16 includes a low pressure compressor 22 and a high pressure compressor 24. The turbine section 20 includes high a pressure turbine 26 and a low pressure turbine 28.

The low pressure compressor 22 is rotationally coupled to the low pressure turbine 28 via a low pressure shaft 30, thereby forming the low pressure spool or low spool 31. High pressure compressor 24 is rotationally coupled to the high pressure turbine 26 via a high pressure shaft 32, forming the high pressure spool or high spool 33.

During operation of the gas turbine engine 10, the fan 12 accelerates air flow from an inlet 34 through bypass duct 14, generating thrust. The core airflow is compressed in the low pressure compressor 22 and the high pressure compressor 24 and then the compressed airflow is mixed with fuel in the combustor 18 and ignited to generate combustion gas.

The combustion gas expands to drive the high and low pressure turbines 26 and 28, which are rotationally coupled to high pressure compressor 24 and low pressure compressor 22, respectively. Expanded combustion gases exit through exhaust nozzle 36, which is shaped to generate additional thrust from the exhaust gas flow.

In advanced turbofan designs, the low pressure shaft 30 may be coupled to fan 12 via geared drive mechanism 37, providing improved fan speed control for increased efficiency and reduced engine noise. Propulsion fan 12 may also function as a first-stage compressor for gas turbine engine 10, with low pressure compressor 22 performing as an intermediate-stage compressor or booster. Alternatively, the low pressure compressor stages are absent, and air from fan 12 is provided directly to high pressure compressor 24, or to an independently rotating intermediate compressor spool.

The gas turbine engine 10 may have a range of different shaft and spool geometries, including one-spool, two-spool and three-spool configurations, in both co-rotating and counter-rotating designs. Gas turbine engine 10 may also be configured as a low bypass turbofan, an open-rotor turbofan, a ducted or un-ducted propeller engine, or an industrial gas turbine.

Figure 2:
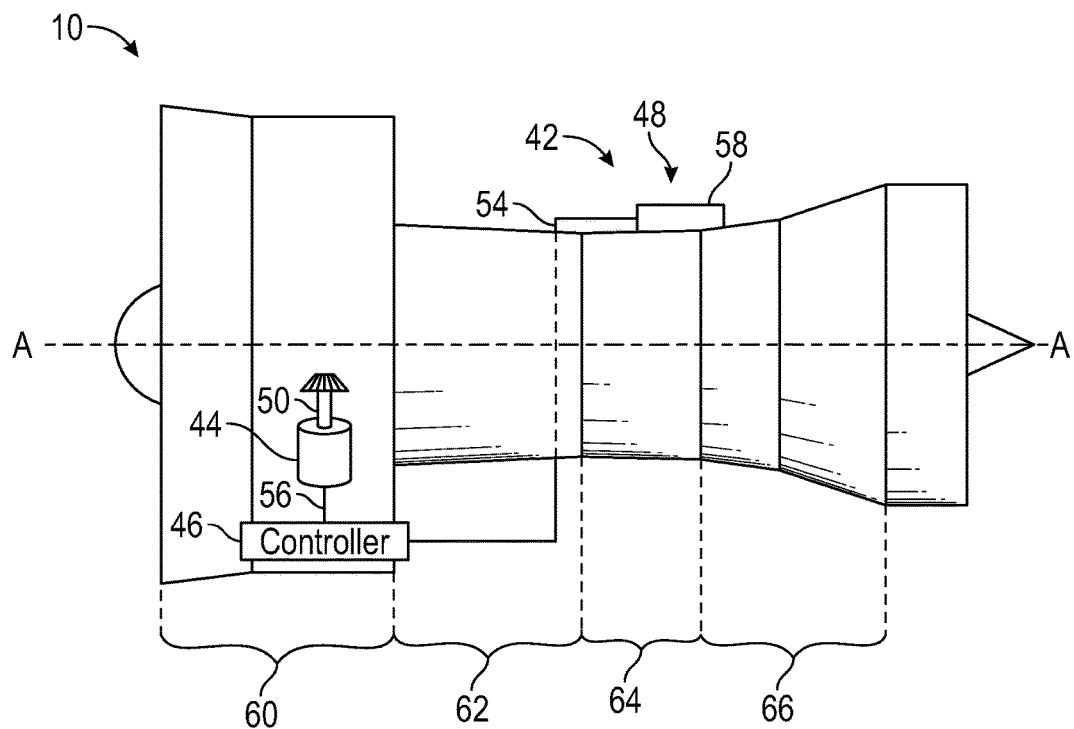
FIG. 2 is a view of a bowed rotor prevention system according to an embodiment of the disclosure.

FIG. 2 is a diagram of a bowed rotor prevention system 42 for gas turbine engine 10 according to an embodiment. In the example of FIG. 2, the bowed rotor prevention system 42 includes a bowed rotor prevention motor 44 (or motor 44), a controller 46, and a thermoelectric generator system 48. The bowed rotor prevention motor 44 may be an electric motor that drives rotation of a drive gear 50 responsive to electricity produced by the thermoelectric generator system 48. In an embodiment, the bowed rotor prevention motor 44 is incapable of driving rotation of turbomachinery of the gas turbine engine 10 at a sufficient speed to start combustion within the gas turbine engine 10. In an embodiment, the bowed rotor prevention motor 44 drives rotation of turbomachinery of the gas turbine engine 10 at less than 1000 RPM about axis A-A and may be incapable of producing sufficient horsepower to reach higher speeds when driving engine rotation. The controller 46 is operable to control a flow of electricity from the thermoelectric generator system 48 to the bowed rotor prevention motor 44. The controller 46 is operable to selectively engage the bowed rotor prevention motor 44 based on detecting an engine shutdown condition of the gas turbine engine 10. For example, the controller 46 can receive an engine shutdown indicator from an engine control (not depicted) of the gas turbine engine 10. Alternatively, an engine shutdown indicator may be received from another source, such as a sensor, an aircraft communication bus, a discrete switch, or the like. The controller 46 can control the flow of electric current on power supply lines 54, 56 between the thermoelectric generator system 48 and the bowed rotor prevention motor 44. The flow of electric current can be controlled by the controller 46 using one or more switching elements, such as relays, (not depicted). The controller 46 may also monitor performance of the thermoelectric generator system 48 and/or the bowed rotor prevention motor 44.

The controller 46 may include memory to store instructions that are executed by a processor. The executable instructions may be stored or organized in any manner and at any level of abstraction, such as in connection with a controlling and/or monitoring operation of one or more systems of the gas turbine engine 10. The processor can be any type of central processing unit (CPU), including a general purpose processor, a digital signal processor, a microcontroller, an application specific integrated circuit (ASIC), a field programmable gate array, or the like. Also, in embodiments, the memory may include random access memory (RAM), read only memory (ROM), or other electronic, optical, magnetic, or any other computer readable medium onto which is stored data and control algorithms in a non-transitory form. The controller 46 can be embodied in an individual line-replaceable unit, within a control system (e.g., in an electronic engine control), and/or distributed between multiple electronic systems.

The thermoelectric generator system 48 can include one or more thermoelectric generator devices 58 coupled to a case of the gas turbine engine 10. Different sections of the gas turbine engine 10 can serve as mounting locations for the thermoelectric generator devices 58 depending on the desired thermal characteristics and available space. For instance, a fan case 60 provides a cooler environment than a compressor case 62, a combustor case 64, or a turbine case 66. Depending on a supported temperature range of the thermoelectric generator devices 58 and a desired thermal gradient for thermoelectric generation, one or more thermoelectric generator devices 58 may be coupled on or between various portions of cases 60-66. The temperature gradient between the hot engine case structure and the ambient air outside of the engine enables each of the thermoelectric generator devices 58 to generate electricity. In one embodiment, eight thermoelectric generator devices 58 are connected in series to form the thermoelectric generator system 48.

Other control aspects related to the bowed rotor prevention system 42 can be managed by the controller 46 and/or other controllers, such as a full authority digital engine control (FADEC). For example, the controller 46 may disengage the bowed rotor prevention motor 44, e.g., disable or reroute power from thermoelectric generator system 48, based on receiving a maintenance request to prevent the bowed rotor prevention motor 44 from driving rotation of the drive gear 50 when a maintenance operation will be performed. Drive gear 50 can be a starter drive gear that is driven be a different source (e.g., an air turbine starter) during normal engine start operations. Alternatively, the drive gear 50 may be a dedicated interface to rotate turbomachinery of the gas turbine engine 10 selectively when a bowed rotor risk is identified.

Figure 3:
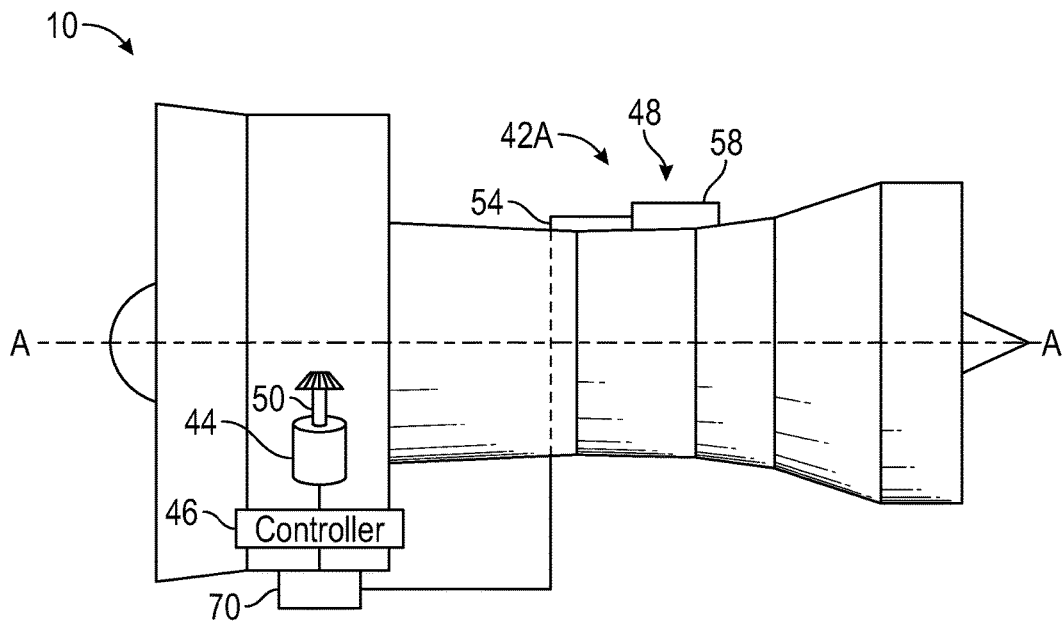
FIG. 3 is a view of a bowed rotor prevention system according to another embodiment of the disclosure.

FIG. 3 is a diagram of a bowed rotor prevention system 42A according to another embodiment. The example of FIG. 3 includes all of the elements of the bowed rotor prevention system 42 of FIG. 2 with an addition of battery 70 interposed between the bowed rotor prevention motor 44 and the thermoelectric generator system 48. The battery 70 is rechargeable with a high capacity, e.g., a lithium-ion battery, supercapacitors, etc. The battery 70 is operable to store an excess portion of the electricity from the thermoelectric generator system 48 and regulate delivery of electricity to the bowed rotor prevention motor 44. For instance, the thermoelectric generator system 48 may generate electricity under operating conditions where bowed rotor prevention is not needed. During such periods of operation the excess electricity produced by the thermoelectric generator system 48, but not needed by the bower rotor prevention motor 44, can be stored as electrical charge in the battery 70. When an engine shutdown condition is detected, the battery 70 can buffer electricity produced by the thermoelectric generator system 48 to maintain a substantially constant speed of the bowed rotor prevention motor 44 until the output of the thermoelectric generator system 48 and battery 70 is diminished due to substantial cooling of the gas turbine engine 10.

Figure 4:
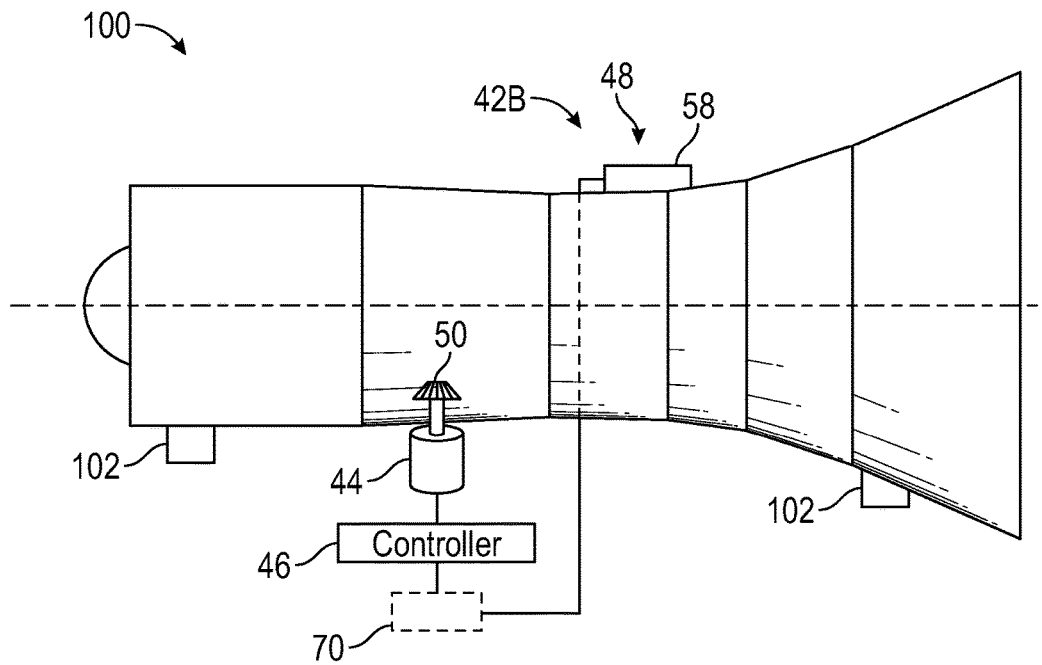
FIG. 4 is a view of a bowed rotor prevention system according to another embodiment of the disclosure.

FIG. 4 is a diagram of a bowed rotor prevention system 42B according to another embodiment as applied to an industrial gas turbine engine 100. In the example of FIG. 4, the industrial gas turbine engine 100 is supported by engine mounts 102 in a non-aerospace application. Similar to the bowed rotor prevention system 42A of FIG. 3, the bowed rotor prevention system 42B of FIG. 4 includes thermoelectric generator system 48 operable to produce electricity from waste heat of industrial gas turbine engine 100. Bowed rotor prevention motor 44 is operable to drive rotation of turbomachinery of the industrial gas turbine engine 100 using the electricity produced by the thermoelectric generator system 48. Controller 46 is operable to selectively apply the electricity to the bowed rotor prevention motor 44 based on detecting an engine shutdown condition of the industrial gas turbine engine 100. Battery 70 may be used to store an excess portion of the electricity from thermoelectric generator system 48 and regulate delivery of the electricity to the bowed rotor prevention motor 44. A greater number of placement options may exist on the industrial gas turbine engine 100 (i.e., versus gas turbine engine 10 of FIGS. 1-3) for the thermoelectric generator devices 58 of the thermoelectric generator system 48, as the weight and packaging constraints are typically reduced in an industrial application as compared to an aerospace application.

Figure 5:
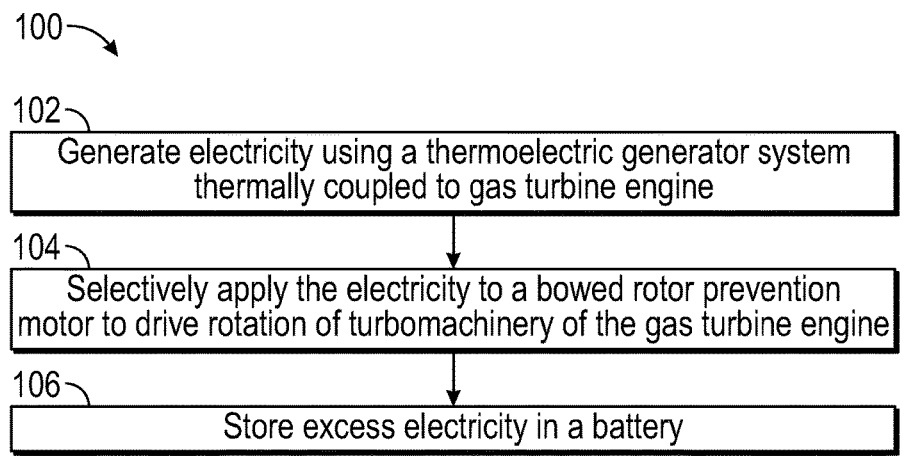
FIG. 5 is a process flow of a method according to embodiments of the disclosure.

FIG. 5 is a process flow of a method 100 according to an embodiment. The method 100 can be implemented by the bowed rotor prevention system 42 of FIG. 2 and/or bowed rotor prevention systems 42A and 42B of FIGS. 3 and 4, and thus FIG. 5 is described with reference to FIGS. 1-4. At block 102, thermoelectric generator system 48 generates electricity based on a thermal gradient. At block 104, the electricity is selectively applied to a bowed rotor prevention motor 44 to drive rotation of turbomachinery of the gas turbine engine 10, 100. The flow of electricity can be controlled by controller 46. The bowed rotor prevention motor 44 drives rotation of turbomachinery of the gas turbine engine 10, 100 at less than a starting speed of the gas turbine engine 10, 100 when powered by the thermoelectric generator system 48. At block 106, an excess portion of the electricity produced by the thermoelectric generator system 48 can be stored in a battery 70. The battery 70 may also regulate delivery of the electricity to the bowed rotor prevention motor 44.

Technical effects and benefits include using waste heat to power a bowed rotor prevention motor to slowly rotate turbomachinery of a gas turbine engine after shutdown to equalize a thermal gradient of rotating parts that were heated during operation. Embodiments can eliminate the risk of the rotor seizing due to a bowed rotor condition. The bowed rotor condition can occur when the engine has stopped and the bow is sufficient to cause the blades to interfere with the casing to such a degree that even the starter motor cannot overcome the friction. Embodiments can avoid or reduce a significant delay in starting the engine, as the operator must otherwise wait for the bowed rotor to cool sufficiently to allow a gap to return between the blades and case.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions or equivalent arrangements not heretofore described, but which are commensurate with the scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

The invention claimed is:

1. A bowed rotor prevention system for a gas turbine engine using waste heat, the bowed rotor prevention system comprising:
a thermoelectric generator system operable to produce electricity from waste heat of the gas turbine engine;
a bowed rotor prevention motor operable to drive rotation of turbomachinery of the gas turbine engine using the electricity produced by the thermoelectric generator system; and
a battery operable to store an excess portion of the electricity and regulate delivery of the electricity to the bowed rotor prevention motor.

2. The bowed rotor prevention system as in claim 1, wherein the bowed rotor prevention motor is an electric motor.

3. The bowed rotor prevention system as in claim 1, further comprising a controller operable to selectively apply the electricity to the bowed rotor prevention motor based on detecting an engine shutdown condition of the gas turbine engine.

4. The bowed rotor prevention system as in claim 1, wherein the thermoelectric generator system comprises a plurality of thermoelectric generator devices thermally coupled to the gas turbine engine.

5. The bowed rotor prevention system as in claim 4, wherein the plurality of thermoelectric generator devices are coupled to a case of the gas turbine engine.

6. The bowed rotor prevention system as in claim 1, wherein the bowed rotor prevention motor drives rotation of a drive gear that rotates a high pressure spool of the gas turbine engine.

7. The bowed rotor prevention system as in claim 1, wherein the gas turbine engine is a turbofan engine.

8. The bowed rotor prevention system as in claim 1, wherein the gas turbine engine is an industrial gas turbine engine.

9. A gas turbine engine comprising:
a drive gear configured to be coupled to a spool of the gas turbine engine; and
a bowed rotor prevention system comprising:
a thermoelectric generator system operable to produce electricity from waste heat of the gas turbine engine;
a bowed rotor prevention motor operable to drive rotation of turbomachinery of the gas turbine engine through the drive gear using the electricity produced by the thermoelectric generator system; and
a battery operable to store an excess portion of the electricity and regulate delivery of the electricity to the bowed rotor prevention motor.

10. The gas turbine engine as in claim 9, wherein the bowed rotor prevention motor is an electric motor.

11. The gas turbine engine as in claim 9, further comprising a controller operable to selectively apply the electricity to the bowed rotor prevention motor based on detecting an engine shutdown condition of the gas turbine engine.

12. The gas turbine engine as in claim 9, wherein the thermoelectric generator system comprises a plurality of thermoelectric generator devices thermally coupled to the gas turbine engine.

13. The gas turbine engine as in claim 9, wherein the gas turbine engine is a turbofan engine.

14. The gas turbine engine as in claim 9, wherein the gas turbine engine is an industrial gas turbine engine.

15. A method of bowed rotor prevention for a gas turbine engine using waste heat, the method comprising:
generating electricity using a thermoelectric generator system coupled to the gas turbine engine;
selectively applying the electricity to a bowed rotor prevention motor to drive rotation of turbomachinery of the gas turbine engine;
storing an excess portion of the electricity in a battery; and regulating delivery of the electricity to the bowed rotor prevention motor through the battery.

16. The method as in claim 15, wherein selectively applying the electricity to the bowed rotor prevention motor is based on detecting an engine shutdown condition of the gas turbine engine.

17. The method as in claim 15, wherein the bowed rotor prevention motor drives rotation of turbomachinery of the gas turbine engine at less than a starting speed of the gas turbine engine when powered by the thermoelectric generator system.

* * * * *